US007588986B2

(12) United States Patent
Jung

(10) Patent No.: US 7,588,986 B2
(45) Date of Patent: Sep. 15, 2009

(54) METHOD OF MANUFACTURING A SEMICONDUCTOR DEVICE

(75) Inventor: Jin-Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 434 days.

(21) Appl. No.: 11/322,883

(22) Filed: Dec. 29, 2005

(65) Prior Publication Data
US 2007/0066087 A1 Mar. 22, 2007

(30) Foreign Application Priority Data
Sep. 20, 2005 (KR) .................. 10-2005-0087327

(51) Int. Cl.
*H01L 21/8234* (2006.01)
(52) U.S. Cl. .................. 438/275; 438/276; 438/289; 438/296; 438/403; 438/201; 438/211; 438/257; 438/593; 438/514; 438/527; 257/E21.409
(58) Field of Classification Search ........... 438/403, 438/201, 211, 257, 593, 514, 527, 275, 276, 438/289, 296; 257/E21.409
See application file for complete search history.

(56) References Cited

U.S. PATENT DOCUMENTS

| 5,183,773 | A * | 2/1993 | Miyata .................. 438/201 |
| 5,403,764 | A * | 4/1995 | Yamamoto et al. ......... 438/257 |
| 6,093,591 | A * | 7/2000 | Sawada .................. 438/207 |
| 6,107,672 | A * | 8/2000 | Hirase ................... 257/544 |
| 6,228,697 | B1 * | 5/2001 | Furukawa et al. .......... 438/228 |
| 6,281,089 | B1 * | 8/2001 | Chen .................... 438/315 |
| 6,328,507 | B1 * | 12/2001 | Shoda ................... 409/220 |
| 6,337,248 | B1 * | 1/2002 | Imai .................... 438/279 |
| 6,436,768 | B1 * | 8/2002 | Yang et al. .............. 438/266 |
| 6,482,692 | B2 * | 11/2002 | Kawasaki et al. .......... 438/218 |
| 6,569,742 | B1 * | 5/2003 | Taniguchi et al. .......... 438/303 |
| 6,713,353 | B1 * | 3/2004 | Kanda et al. ............. 438/275 |
| 6,753,231 | B2 * | 6/2004 | Ikeda et al. ............. 438/289 |
| 6,835,662 | B1 * | 12/2004 | Erhardt et al. ........... 438/689 |
| 6,933,188 | B1 * | 8/2005 | Verma et al. ............. 438/197 |
| 7,015,101 | B2 * | 3/2006 | Zheng et al. ............. 438/258 |
| 7,029,976 | B1 * | 4/2006 | Nagarad et al. ........... 438/258 |
| 7,172,940 | B1 * | 2/2007 | Chen et al. .............. 438/258 |
| 7,179,709 | B2 * | 2/2007 | Kim et al. ............... 438/257 |
| 7,196,395 | B2 * | 3/2007 | Kumagai et al. ........... 257/506 |
| 2002/0098638 | A1 * | 7/2002 | Yaegashi et al. .......... 438/217 |
| 2002/0197800 | A1 * | 12/2002 | Hashimoto et al. ......... 438/266 |
| 2003/0232284 | A1 * | 12/2003 | Liu et al. ............... 430/314 |
| 2004/0023451 | A1 * | 2/2004 | Lee et al. ............... 438/201 |
| 2004/0023459 | A1 * | 2/2004 | Masuoka ................. 438/275 |
| 2005/0014352 | A1 * | 1/2005 | Torii et al. .............. 438/591 |

(Continued)

*Primary Examiner*—Fernando L Toledo
*Assistant Examiner*—Ankush k Singal
(74) *Attorney, Agent, or Firm*—The Law Offices of Andrew D. Fortney; Andrew D. Fortney; William K. Nelson

(57) ABSTRACT

According to an exemplary embodiment of the present invention, a method of manufacturing a semiconductor device having active regions including a SONOS device region, a high voltage device region, and a logic device region, includes defining the active regions by forming a device isolation region on a semiconductor substrate; performing ion-implantation in the SONOS device region to control a threshold voltage of a SONOS device; performing ion-implantation in the high voltage device region to form a well; performing ion-implantation in the SONOS device region and the logic device region to form a well; and forming an ONO pattern on the SONOS device region, generally by performing a photolithography and etching process on the ONO layer.

20 Claims, 5 Drawing Sheets

U.S. PATENT DOCUMENTS

| | | | |
|---|---|---|---|
| 2005/0023604 A1* | 2/2005 | Kim et al. | 257/316 |
| 2005/0079674 A1* | 4/2005 | Zheng et al. | 438/258 |
| 2005/0186741 A1* | 8/2005 | Roizin et al. | 438/275 |
| 2006/0035432 A1* | 2/2006 | Kim et al. | 438/257 |
| 2006/0076598 A1* | 4/2006 | Higashi et al. | 257/296 |
| 2006/0091470 A1* | 5/2006 | Noguchi et al. | 257/369 |
| 2006/0223266 A1* | 10/2006 | Lim et al. | 438/275 |
| 2007/0032006 A1* | 2/2007 | Liu et al. | 438/197 |
| 2007/0122981 A1* | 5/2007 | Park | 438/275 |
| 2008/0090364 A1* | 4/2008 | Ema et al. | 438/294 |

* cited by examiner

METHOD OF MANUFACTURING A SEMICONDUCTOR DEVICE

CROSS-REFERENCE TO RELATED APPLICATION

This application claims priority to and the benefit of Korean Patent Application No. 10-2005-0087327, filed in the Korean Intellectual Property Office on Sep. 20, 2005, the entire contents of which are incorporated herein by reference.

BACKGROUND OF THE INVENTION (a) Field of the Invention

The present invention relates to a method of manufacturing a semiconductor device. More particularly, the present invention relates to a method of manufacturing a semiconductor device including a floating gate and/or charge trapping type of memory device.

(b) Description of the Related Art

A flash memory device is a non-volatile memory device which maintains data stored therein as long as an erasing operation is not applied. Compared to a volatile memory device such as a DRAM, a non-volatile memory device has merits in that circuits for a refresh operation are unnecessary, and power consumption can be reduced. However, a high voltage should be applied to input or erase data in a non-volatile memory device, and an additional storage structure is used to retain data in a non-volatile memory device when power is not applied. Therefore, a non-volatile memory device may have a relatively complicated structure and manufacturing process as compared to certain types of volatile memories (e.g., static RAM, or SRAM).

Non-volatile memory devices may be classified into a floating gate type of device and a floating trap type of device. A floating trap type of device is programmed by storing charges on a charge trapping surface between a semiconductor substrate and a gate electrode. A floating trap generally comprises a charge storage (or charge trapping layer) generally formed from silicon nitride, a blocking insulation layer formed on an upper part or upper surface of the charge storage layer, and a tunneling insulation layer formed on a lower part or a lower surface of the charge storage layer. A typical structure for a floating trap type device is a SONOS (silicon oxide nitride oxide semiconductor) structure, and a SONOS structure has a floating trap which generally comprises of a nitride layer-oxide layer interface in an ONO (oxide-nitride-oxide) structure.

In forming an embedded SONOS device, such a SONOS device and a logic device should be simultaneously formed. However, part of a SONOS process may be performed before forming a well in a process for forming a logic device, because a SONOS device should have characteristics of a conventional logic device. Therefore, an ONO layer may be damaged when ion-implantation for forming a well in a logic device is performed in the presence of an exposed ONO pattern in a SONOS device region. Consequently, when an ONO layer is damaged by such ion implantation, the ONO layer may later explode or otherwise fail.

The above information disclosed in this Background section is only for enhancement of understanding of the background of the invention, and therefore, it may contain information that does not form prior art or other information that may be already known in this or any other country to a person of ordinary skill in the art.

SUMMARY OF THE INVENTION

The present invention has been made in an effort to provide a method of manufacturing a semiconductor device having advantages of preventing an explosion or other failure of an ONO layer.

According to an exemplary embodiment of the present invention, a method of manufacturing a semiconductor device having active regions including a SONOS device region, a high voltage device region, and a logic device region, may comprise: defining the active region(s) by forming a device isolation region on and/or in a semiconductor substrate; implanting ions in the SONOS device region to control a threshold voltage of a SONOS device; implanting ions to form a first well in the high voltage device region; implanting ions to form a second well in the SONOS device region and a third well in the logic device region; and forming an ONO pattern on the SONOS device region.

In addition, the exemplary method of manufacturing a semiconductor device may further include: forming a first gate oxide layer on the logic device region, the high voltage device region, and the SONOS device region; forming a second gate oxide layer on the logic device region after removing the first gate oxide layer on the logic device region; and forming a gate electrode on the first gate oxide layer, the second gate oxide layer, and the SONOS device region.

In addition, the ONO layer may comprise a first oxide layer, a nitride layer, and a second oxide layer.

DETAILED DESCRIPTION OF THE EMBODIMENTS

Figure 1:
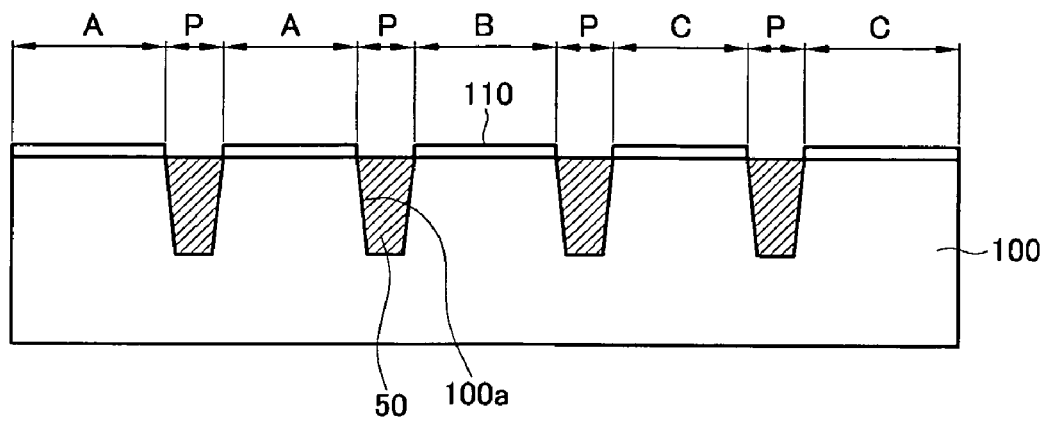
FIGS. 1 to 9 are cross-sectional views showing sequential stages of a method of manufacturing a semiconductor device according to an exemplary embodiment of the present invention.

An exemplary embodiment of the present invention will hereinafter be described in detail with reference to the accompanying drawings.

With reference to the accompanying drawings, the present invention will be described in order for those skilled in the art to be able to implement the invention. As those skilled in the art would realize, the described embodiments may be modified in various different ways, all without departing from the spirit or scope of the present invention.

To clarify multiple layers and regions, the thicknesses of the layers may be enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

FIGS. 1 to 9 are cross-sectional views showing sequential stages of a method of manufacturing a semiconductor device according to an exemplary embodiment of the present invention.

As shown in FIG. 1, device isolation regions P and active regions A, B, and C are formed on a semiconductor substrate 100 comprising silicon (e.g., single-crystal silicon, epitaxial Si or SiGe, etc.). The device isolation regions P are formed by filling a trench 100a on the semiconductor substrate 100 with an insulation layer 50.

A pad oxide layer 110 is formed on the active regions A, B, and C. The pad oxide layer 110 performs a buffering function in order to protect the semiconductor substrate 100 during a CMP process and/or a trench-defining and/or etching process for forming isolation regions P. The active regions A, B, and C generally correspond to logic device regions A, a SONOS device region B, and high voltage device regions C, and each active region is separated from one another by the device isolation regions P.

Figure 2:
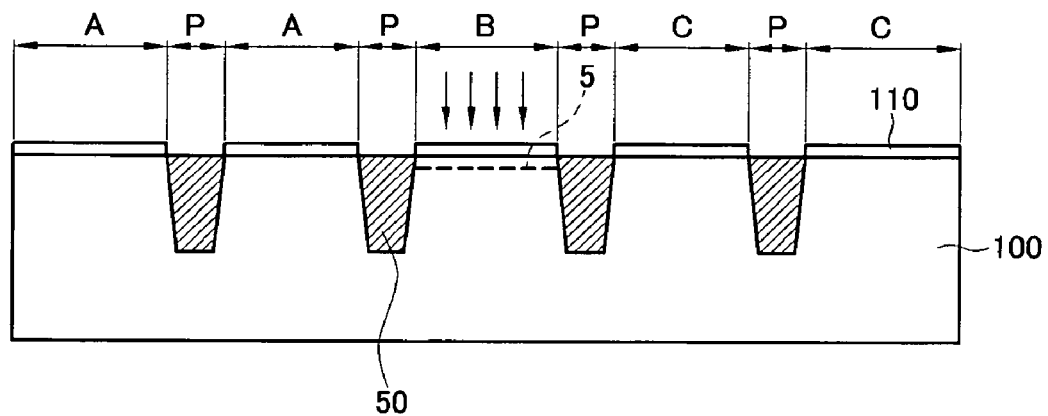

Subsequently, as shown in FIG. 2, an ion implantation process is performed in the SONOS device region B in order to control a threshold voltage of a SONOS device. Therefore, an ion implant region 5 for controlling a SONOS device threshold voltage is formed on or in a surface of the SONOS device region B. During this ion implantation, the other regions (e.g., logic device regions A and high voltage device regions C) are generally masked or blocked (e.g., by a patterned photoresist).

Figure 3:
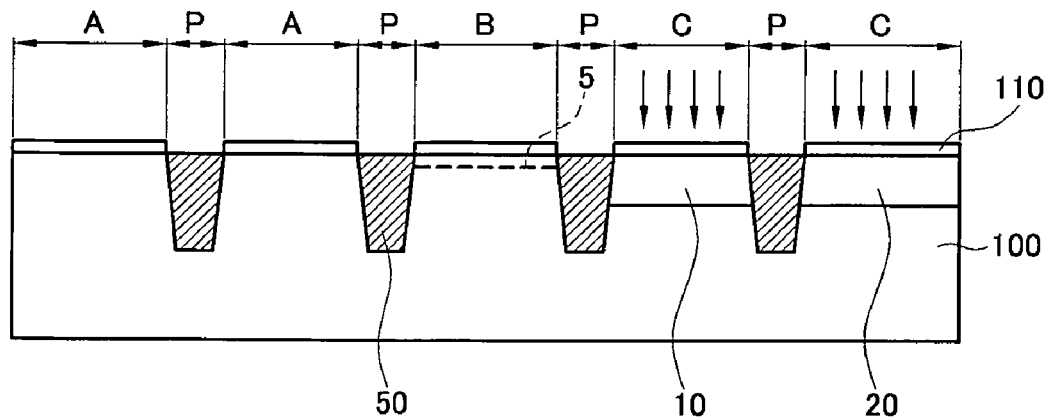

Subsequently, as shown in FIG. 3, an ion implantation process for forming a well is performed in the high voltage device regions C. Therefore, wells 10 and 20 (e.g., respectively for an NMOS device and a PMOS device) are formed in the high voltage device regions C. A charge pumping circuit may be formed in one or more of the high voltage device regions C. The charge pumping circuit accumulates charge (or charge carriers) in order to obtain a high voltage that can be used in programming and erasing operations of SONOS devices. During this well ion implantation step, the other regions (e.g., logic device regions A and SONOS device region[s] B) are generally masked or blocked (e.g., by a patterned photoresist).

Figure 4:
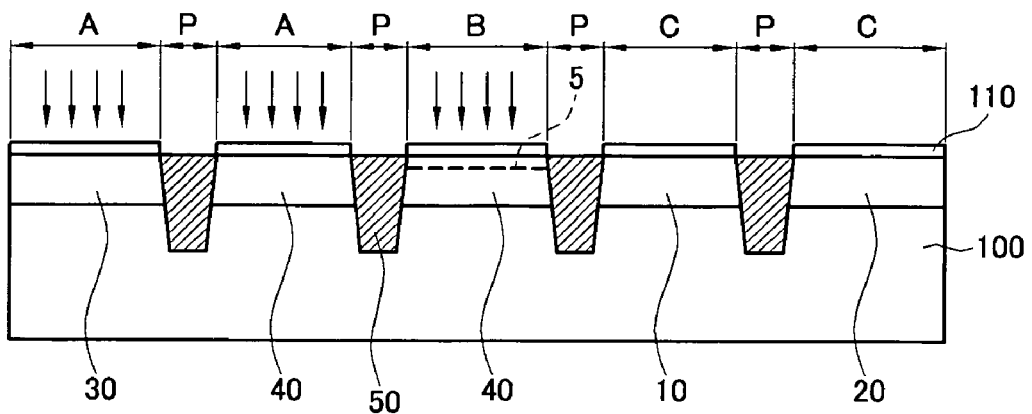

Subsequently, as shown in FIG. 4, an ion implantation process for forming a well is performed in the SONOS device region B and in logic device region A through the pad oxide layer 110 (e.g., using the pad oxide layer 110 as a blocking layer). Therefore, a well 40 for a PMOS device may be formed in the SONOS device region B, and wells 40 and 30 (e.g., respectively for PMOS and NMOS devices) may be formed in the logic device regions A. During this well ion implantation step, the high voltage regions C are generally masked or blocked (e.g., by a patterned photoresist).

Figure 5:
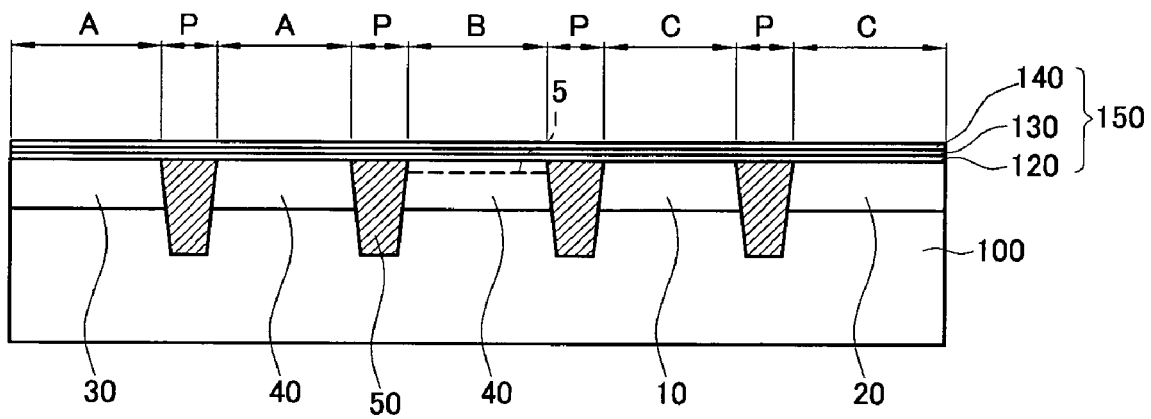

Subsequently, as shown in FIG. 5, an ONO (oxide-nitride-oxide) layer 150 is formed on the semiconductor substrate 100 after removing the pad oxide layer 110. The ONO layer 150 comprises a first oxide layer 120, a nitride layer 130, and a second oxide layer 140. The first oxide layer 120 may comprise a tunnel oxide (e.g., a layer adapted to perform or provide a tunneling insulation layer function), the nitride layer 130 may comprise a charge storage or a charge trapping layer (or perform or provide a charge storage or charge trapping function), and the second oxide layer 140 may comprise a blocking or gate insulation layer (or perform or provide a charge blocking or gate insulation function).

Figure 6:
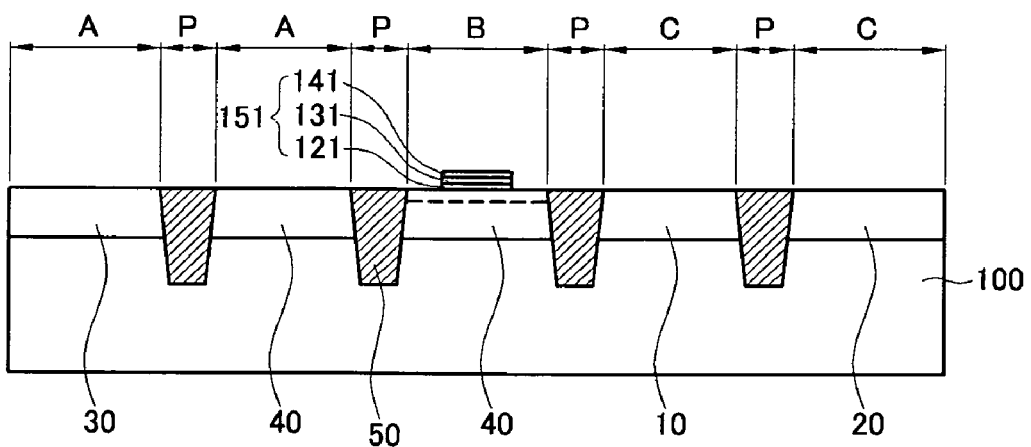

Subsequently, as shown in FIG. 6, an ONO pattern 151 is formed only on the SONOS region B by removing the ONO layer 150 in the regions A and C and not in the SONOS device region B. The ONO pattern 151 is composed of a first oxide layer pattern 121, a nitride layer pattern 131, and a second oxide layer pattern 141. Typically, the ONO layer 150 is patterned by conventional photolithographic patterning of a photoresist, followed by conventional wet and/or dry etching of the individual oxide and nitride layers 140, 130 and 120 of the ONO layer 150 using the patterned photoresist as a mask.

Figure 7:
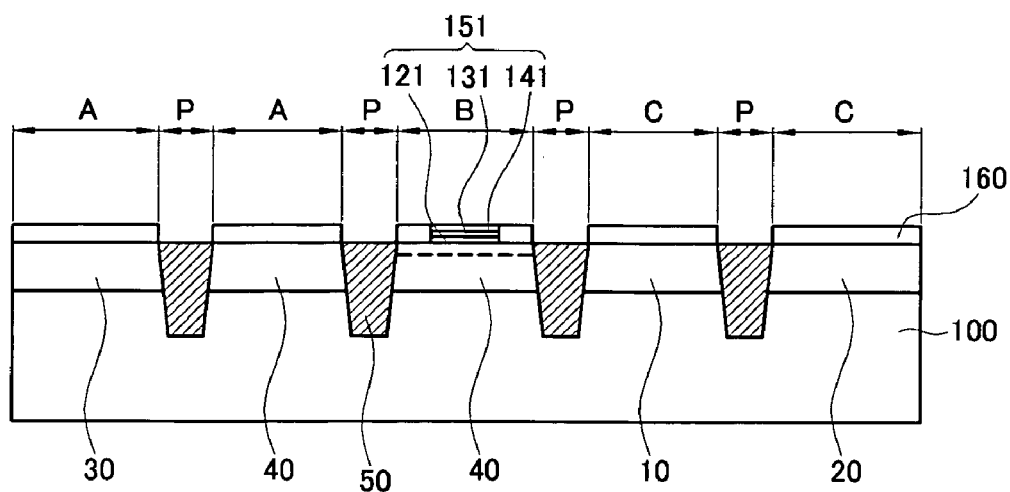

Subsequently, as shown in FIG. 7, a first gate oxide layer 160 is formed on the logic device region A, the high voltage device region C, and the SONOS device region B.

Figure 8:
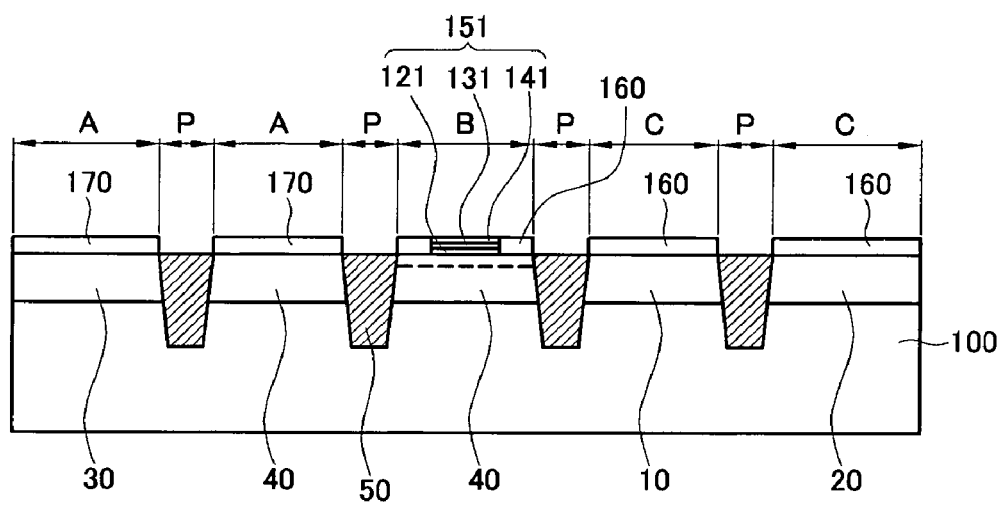

Subsequently, as shown in FIG. 8, the first gate oxide layer 160 on the logic device region A is removed. While removing the first gate oxide layer 160 in the logic device region A, the other regions (e.g., SONOS device region B and high voltage device regions C) are generally masked or blocked (e.g., by a patterned photoresist). In addition, a second gate oxide layer 170 (typically having a thickness different from that of the first gate oxide layer 160) is formed on the logic device region A. The first and second gate oxide layers 150 and 160 may be formed, e.g., by conventional wet or dry thermal oxidation.

Figure 9:
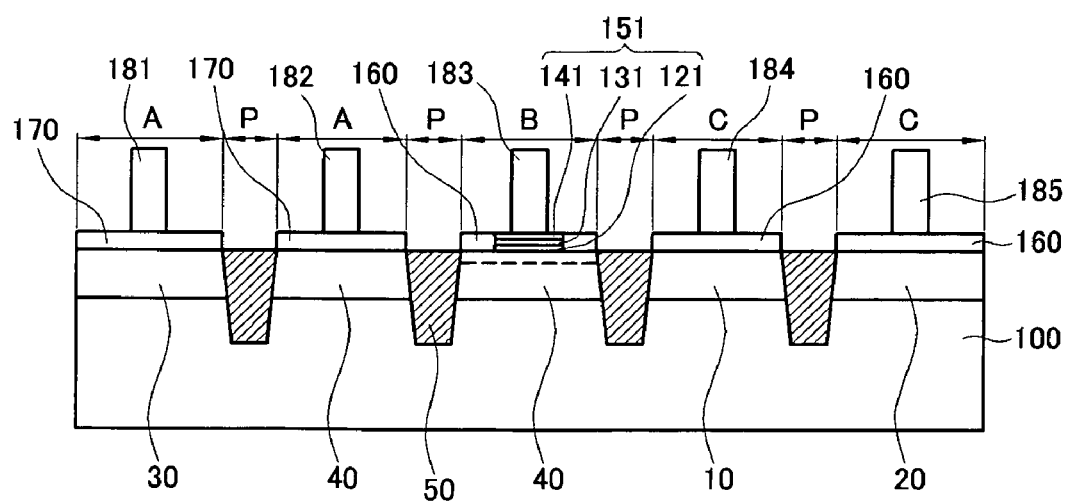

Subsequently, as shown in FIG. 9, gate electrodes 181, 182, 183, 184, and 185 are formed by depositing a polysilicon layer, then performing a conventional photolithography and etching process.

As described above, since a well implantation process in a logic device region is performed before any ONO layer(s) are deposited, the ONO layer is not damaged by the well implantation process. Consequently, an explosion (or other implant-related failure) of the ONO layer may be prevented.

Figure 10:
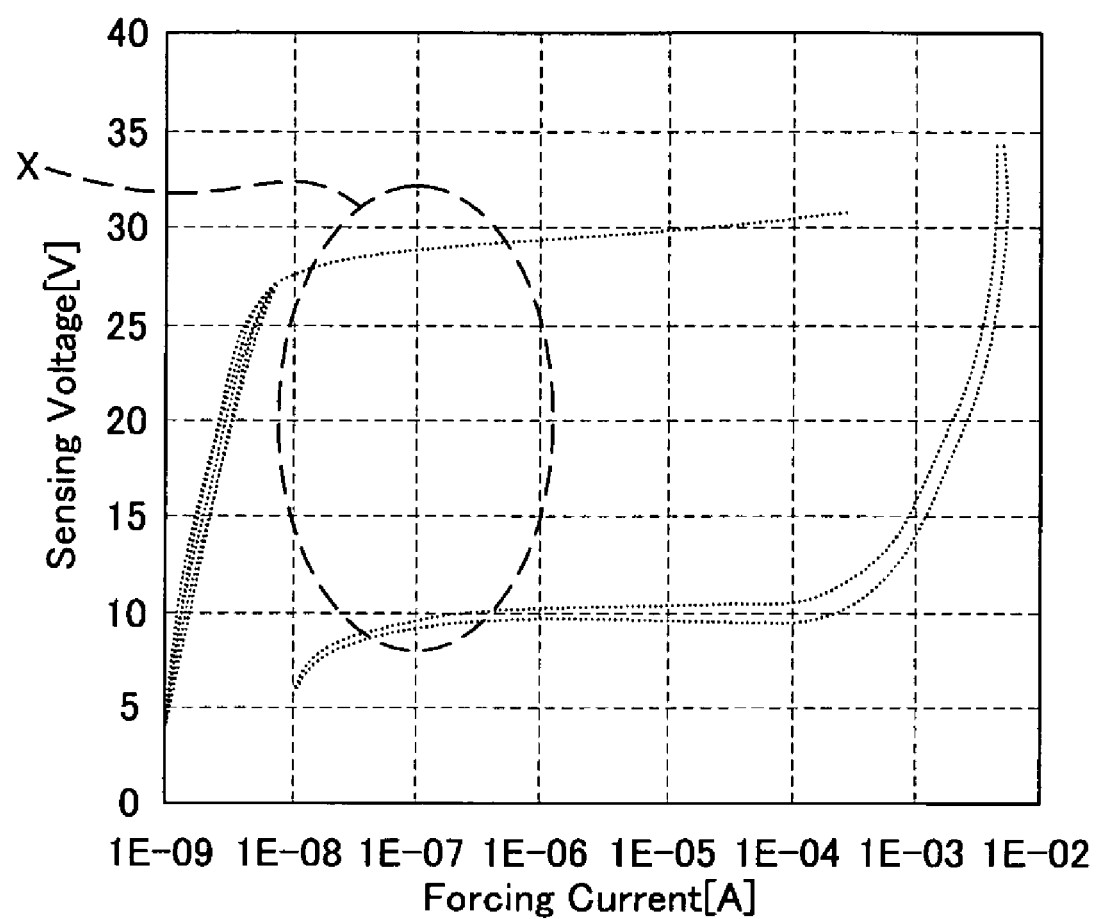
FIG. 10 is a graph showing results of a current ramping stress test for a semiconductor device manufactured by a conventional method.

FIG. 10 is a graph showing results of a current ramping stress test for an ONO pattern of a semiconductor device manufactured by a conventional method. A current ramping stress test is a test to measure voltage applied at both ends of an ONO pattern after directing a current into a gate electrode of a SONOS device. As shown in FIG. 10, 20 to 40% of chips included in a single wafer have defects that appear to be caused by implant damage to (e.g., catastrophic failure of and/or an explosion in) an ONO layer.

Figure 11:
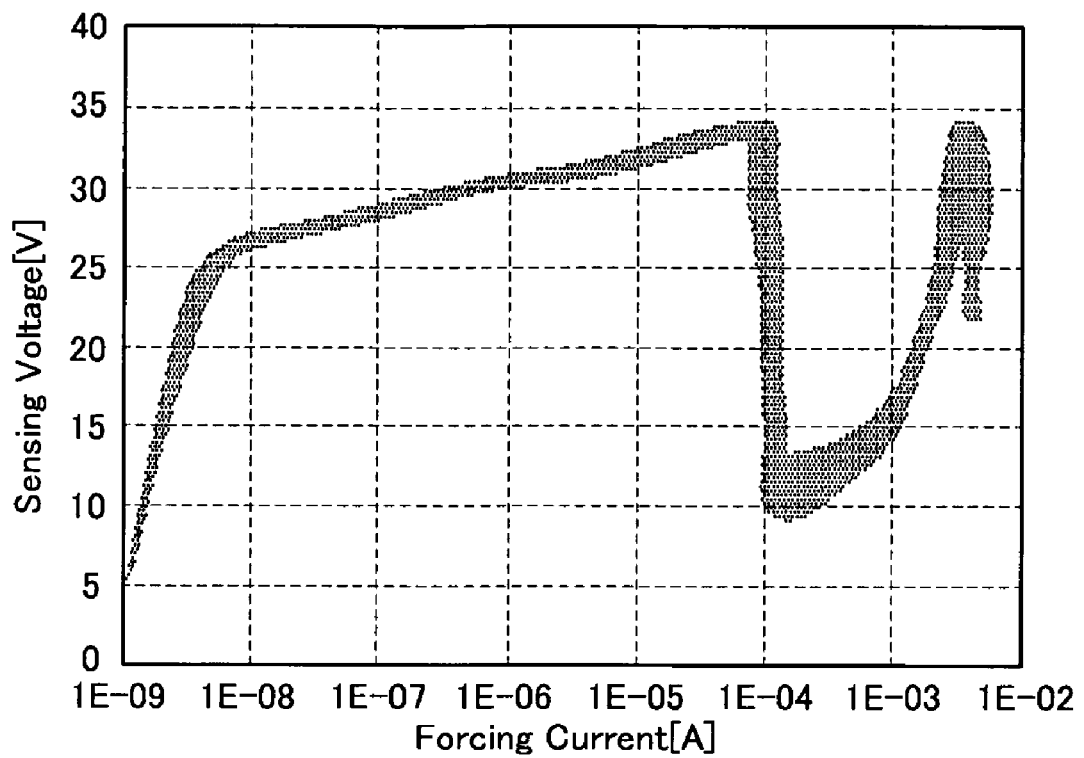
FIG. 11 is a graph showing results of a current ramping stress test for a semiconductor device manufactured by a method according to an exemplary embodiment of the present invention.

FIG. 11 is a graph showing results of a current ramping stress test for a semiconductor device manufactured by a method according to an exemplary embodiment of the present invention. As shown in FIG. 11, implant damage (e.g., an explosion) does not appear to occur in chips on a wafer manufactured in accordance with the present invention, and a breakdown characteristic of an ONO layer in the present non-volatile device is uniformly maintained.

Therefore, a semiconductor device in which an explosion of an ONO layer does not occur may be manufactured by a method according to an exemplary embodiment of the present invention. That is, since an ion implantation process for forming a well in a logic device is performed before depositing an ONO layer, the ONO layer is not damaged by the ion implantation process for forming a well. Therefore, yield and durability of a corresponding SONOS semiconductor device may be enhanced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device having active regions including a SONOS device region, a high voltage device region, and a logic device region, comprising:

defining the active regions by forming device isolation regions on a semiconductor substrate;

implanting first ions in the SONOS device region to control a threshold voltage of a SONOS device;

implanting second ions in the high voltage device region to form a first well;

implanting third ions into an entire width of the SONOS device region between adjacent device isolation regions and into an entire width of the logic device region between adjacent device isolation regions to form a plurality of second wells, wherein a depth of the plurality of second wells is less than a depth of the device isolation regions; and forming an ONO pattern on the SONOS device region.

2. The method of claim 1, further comprising:

forming a first gate oxide layer on the high voltage device region and the SONOS device; and forming a second gate oxide layer on the logic device region.

3. The method of claim 1, wherein the ONO layer comprises a first oxide layer, a nitride layer, and a second oxide layer.

4. The method of claim 1, further comprising forming a pad oxide layer over the active regions prior to implanting first, second, and third ions in the active regions.

5. The method of claim 1, wherein the ONO pattern is formed on the SONOS device region including the second well.

6. The method of claim 1, wherein the third ions are implanted simultaneously in the SONOS device region and in the logic device region to form the plurality of second wells.

7. The method of claim 2, wherein forming the second gate oxide layer further comprises:

forming said first gate oxide layer on the logic device region; and after removing the first gate oxide layer on the logic device region, forming the second gate oxide layer on the logic device region.

8. The method of claim 2, further comprising:

forming a gate electrode on the first gate oxide layer, the second gate oxide layer, and the SONOS device region.

9. The method of claim 2, wherein the ONO layer comprises a first oxide layer, a nitride layer, and a second oxide layer.

10. The method of claim 2, wherein patterning the first oxide layer, the nitride layer, and the second oxide layer exposes a portion of the upper surface of the semiconductor substrate in the SONOS device region, and the portion of the upper surface of the semiconductor substrate is covered by the first gate oxide layer.

11. The method of claim 3, wherein the plurality of second wells comprises an NMOS well region and a PMOS well region in the logic device region, the NMOS well region and the PMOS well region being separated by the device isolation regions.

12. The method of claim 4, further comprising forming an ONO layer on the semiconductor substrate by sequentially depositing a first oxide layer, a nitride layer, and a second oxide layer prior to forming the ONO pattern.

13. The method of claim 12, wherein patterning the first oxide layer, the nitride layer, and the second oxide layer comprises performing a photolithography and etching process.

14. The method of claim 12, further comprising removing the pad oxide layer prior to forming the first oxide layer, the nitride layer, and the second oxide layer.

15. The method of claim 11, wherein the plurality of second wells further comprises a second PMOS well region in the SONOS device region, the second PMOS well region being separated from the PMOS well region by the device isolation regions.

16. The method of claim 15, wherein the first well has a depth that is less than the depth of the device isolation regions and the first well comprises a second NMOS well region and a third PMOS well region, the second NMOS well region and the third PMOS well region being separated by the device isolation regions.

17. The method of claim 16, wherein the second NMOS well region is separated from the second PMOS well region by the device isolation regions.

18. The method of claim 17, further comprising forming a polysilicon layer over the semiconductor device and on the second oxide layer after forming the ONO pattern, and patterning the polysilicon layer to form gate electrodes over the SONOS device region, the high voltage device region, and the logic device region.

19. The method of claim 18, further comprising patterning the polysilicon layer to form gate electrodes over the NMOS well region in the logic device region, the PMOS well region in the logic device region, the ONO pattern in the SONOS device region, the second NMOS well region in the high voltage device region, and the third PMOS well region in the high voltage device region.

20. The method of claim 16, wherein the second ions are implanted into entire widths of the second NMOS well region and the third PMOS well region between the device isolation regions.

* * * * *